(12) United States Patent
Yamaguchi

(10) Patent No.: US 7,257,500 B2
(45) Date of Patent: Aug. 14, 2007

(54) SIGNAL DETECTING METHOD AND DEVICE, AND RADIATION IMAGE SIGNAL DETECTING METHOD AND SYSTEM

(75) Inventor: Akira Yamaguchi, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/081,661

(22) Filed: Mar. 17, 2005

(65) Prior Publication Data

US 2005/0209803 A1    Sep. 22, 2005

(30) Foreign Application Priority Data

Mar. 18, 2004    (JP)    ............................. 2004-078415

(51) Int. Cl.
*G01R 13/00*    (2006.01)
*G01R 29/26*    (2006.01)

(52) U.S. Cl. ........................................................ 702/69

(58) Field of Classification Search ................. 702/69, 702/66, 71, 190, 189

See application file for complete search history.

(56) References Cited

U.S. PATENT DOCUMENTS 4,370,643 A * 1/1983 Kitamura .................... 341/123
7,135,681 B2 * 11/2006 Yamaguchi ............... 250/336.1
7,170,082 B2 * 1/2007 Yamaguchi ................. 250/591
2005/0219534 A1 * 10/2005 Makino ....................... 356/417

OTHER PUBLICATIONS

Richard L. Weisfield and N. Robert Bennett: "Electronic noise analysis of a 127 -micron pixel TFT/photodiode array", Medical Imaging 2001: Physics of Medical Imaging, Larry E. Antonuk, Martin J. Yafffe, Eds., Proceedings of SPIE, Feb. 16, 2001, San Diego, CA, USA, vol. 4320 (Jun. 2001), pp. 209-218.

* cited by examiner

*Primary Examiner*—Michael P. Nghiem
(74) *Attorney, Agent, or Firm*—Sughrue Mion, PLLC

(57) ABSTRACT

A signal detecting method, which employs correlated double sampling, capable of setting an appropriate baseline sampling time and improving signal-to-noise ratio of the signal. The time constant $\tau$ in the low-pass filtering by a first holding circuit, which is constructed to sample the baseline signal, and the baseline sampling time t are set at values that satisfy the relationship of $t \geq 10 \times \tau$.

9 Claims, 7 Drawing Sheets

SIGNAL DETECTING METHOD AND DEVICE, AND RADIATION IMAGE SIGNAL DETECTING METHOD AND SYSTEM

BACKGROUND OF THE INVENTION

1. Field of the Invention

The present invention relates to a signal detecting method and device, and a radiation image signal detecting method and system that employ correlated double sampling.

2. Description of the Related Art

Photoelectric converters constructed to receive light and output charge signals through the photoelectric conversion, such as CCDs, photomultipliers and the like, are used in various fields. In addition, radiation image recording devices constructed to receive radiation to store charges and output charge signals in proportion to the charges stored therein are also used widely.

As for the detectors for detecting the charge signals outputted from these photoelectric converters and radiation image recording devices described above, integrating amplifiers are generally used, because they can be built into an integrated circuit and have comparatively low noise. The integrating amplifier initiates storage of the charge signals when switched to storage mode, and outputs an electrical signal in proportion to the amount of charges stored therein by discharging the stored charge signals when switched to reset mode.

Here, the switching to the storage mode of the integrating amplifier is implemented by switching the reset switch on the integrating amplifier from ON to OFF. The switching of the reset switch causes kTC noise of the reset switch to be added to the signal component of the electrical signal. In order to avoid the influence of kTC noise, correlated double sampling is implemented, as is described, for example, in the non-patent document "Electronic noise analysis of a 127-micron pixel TFT/photodiode array", R. L. Weisfield and N. R. Bennett, SPIE, vol. 4320, pp 209-218, 2001. In the method, the difference between an electrical signal outputted from the integrating amplifier when a predetermined baseline sampling time has elapsed after it is switched to storage mode and an electrical signal outputted from the integrating amplifier just before it is switched to reset mode is obtained, and this difference is used as the signal component, thereby the influence of kTC noise is avoided.

In a circuit that performs the correlated double sampling described above, a low-pass filter is used at the latter stage of the integrating amplifier in order to reduce high-frequency noise, and the electrical signal outputted from the integrating amplifier is outputted through the filter.

Low-pass filters, however, have a certain transient response time. Therefore, when a low-pass filter is used as described above, if the baseline sampling time is too short in the correlated double sampling described above, the electrical signal of noise component that has a sufficient magnitude may not be obtained. Consequently, the noise component is added to the signal component, causing degradation of signal-to-noise ratio. Generally, a shorter baseline sampling time is preferable in order to reduce the signal detection time. When a value of the time constant of the low-pass filter is $\tau$, the baseline sampling time is generally set at a value, for example, in the range of $1\tau$ to $2\tau$, which is not the value determined by taking into account the transient response time.

SUMMARY OF THE INVENTION

The present invention has been developed in view of the circumstances described above, and it is an object of the present invention to provide a signal detecting method and device, and a radiation image signal detecting method and system that employ correlated double sampling, and capable of setting an appropriate baseline sampling time and improving signal-to-noise ratio of the signal.

A signal detecting method of the present invention comprises the steps of:

initiating storage of charge signals by an integrating amplifier;

holding a first electrical signal outputted from the integrating amplifier when a predetermined baseline sampling time has elapsed from the time when the storage is initiated, and passed through a first low-pass filter; and obtaining the difference between a second electrical signal and the first electrical signal to detect the signal, the second electrical signal being outputted from the integrating amplifier after the first electrical signal is held and before the integrating amplifier is reset, and passed through a second low-pass filter, wherein the time constant $\tau$ of the first low-pass filter and the baseline sampling time t are set at values that satisfy the relationship of $t \geq 10 \times \tau$.

In the signal detecting method described above, the time constant $\tau$ of the first low-pass filter and the baseline sampling time t may be set at values that satisfy the relationship of $20 \times \tau \geq t \geq 10 \times \tau$.

A signal detecting device of the present invention comprises:

an integrating amplifier for storing charge signals;

a first low-pass filter for receiving a first electrical signal outputted from the integrating amplifier when a predetermined baseline sampling time has elapsed from the time when the storage is initiated by the integrating amplifier;

a first holding circuit for holding the first electrical signal passed through the first low-pass filter;

a second low-pass filter for receiving a second electrical signal outputted from the integrating amplifier after the first electrical signal is held by the first holding circuit and before the integrating amplifier is reset;

a second holding circuit for holding the second electrical signal passed through the second low-pass filter; and a differential circuit for obtaining the difference between the second electrical signal and the first electrical signal to detect the signal, wherein the time constant $\tau$ of the first low-pass filter and the baseline sampling time t are set at values that satisfy the relationship of $t \geq 10 \times \tau$.

In the signal detecting device described above, the time constant $\tau$ of the first low-pass filter and the baseline sampling time t may be set at values that satisfy the relationship of $20 \times \tau \geq t \geq 10 \times \tau$.

A radiation image signal detecting method of the present invention is a method for detecting charge signals outputted from a radiation image recording device constructed to receive radiation to store charges and output charge signals in proportion to the charges stored therein, using the signal detecting method described above.

A radiation image signal detecting system of the present invention comprises:

the signal detecting device described above; and a radiation image recording device constructed to receive radiation to store charges therein and output charge signals to the signal detecting device described above in proportion to the charges stored therein.

As for the "first low-pass filter" and "second low-pass filter", a common low-pass filter may be used, or they may be provided separately.

As for the "first low-pass filter" and "second low-pass filter", for example, a primary filter may be used.

As for the "first holding circuit" and "second holding circuit", a common holding circuit may be used, or they may be provided separately.

According to the signal detecting method and device, and the radiation image signal detecting method and system of the present invention, the time constant $\tau$ of the first low-pass filter and the baseline sampling time t are set at values that satisfy the relationship of $t \geq 10 \times \tau$, so that an appropriate baseline sampling time which is sufficient to cover the transient response time of the first low-pass filter may be secured and the electrical signal of the noise component that has a sufficient magnitude maybe obtained. Thus, the noise component is prevented from being added to the signal component and the signal-to-noise ratio of the electrical signal is improved.

Further, when the time constant $\tau$ of the first low-pass filter and baseline sampling time t are set at values that satisfy the relationship of $t \geq 10 \times \tau$, any further extended sampling time t does not change the noise performance. But, a longer sampling time t results in a longer signal detection time, causing a prolonged signal reading cycle for an entire radiation image. That is, a longer processing time is required for obtaining the image signals of the entire radiation image. Consequently, when the $\tau$ and t are set at values that satisfy the relationship of $20 \times \tau \geq t \geq 10 \times \tau$ in the signal detecting method and device, and the radiation image signal detecting method and system described above, the signal-to-noise ratio of the electrical signal may be improved, and at the same time a certain level of processing speed may be ensured.

DESCRIPTION OF THE PREFERRED EMBODIMENTS

Figure 1:
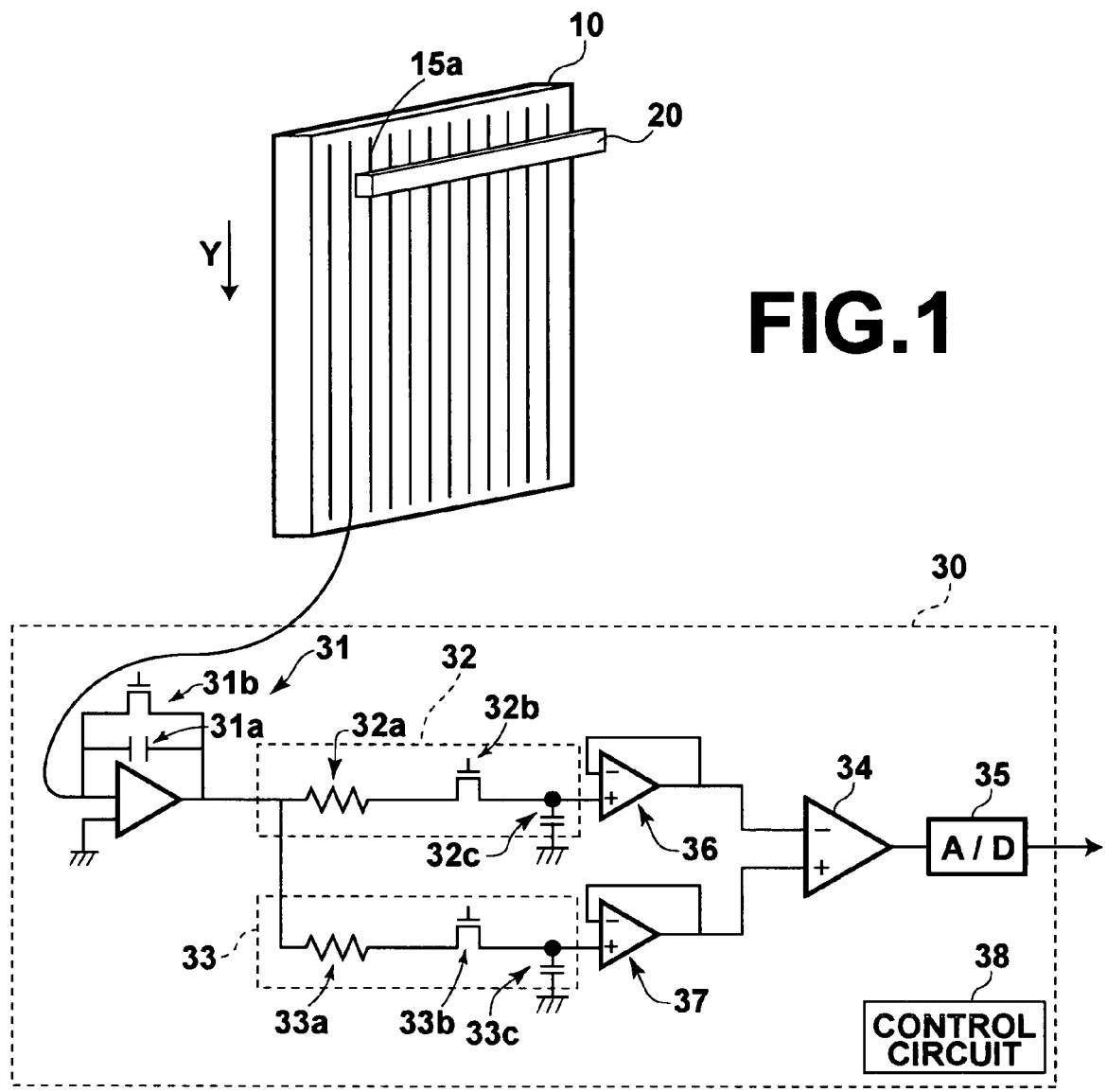
FIG. 1 is a block diagram that illustrates the schematic construction of a radiation image signal detecting system that employs an embodiment of the signal detecting device of the present invention.

Hereinafter, a radiation image signal detecting system that employs an embodiment of the signal detecting device for performing a signal detecting method of the present invention will be described with reference to the accompanying drawings. FIG. 1 is a block diagram that illustrates the schematic construction of a radiation image signal detecting system that employs an embodiment of the signal detecting device of the present invention.

The radiation image signal detecting system described above has a radiation source not shown in the drawing; a radiation image recording device 10 for receiving radiation emitted from the radiation source and transmitted through a subject to record the radiation image of the subject therein and outputting charge signals in proportion to the radiation image recorded therein; a reading light source section 20 for scanning the radiation image recording device 10 with linear reading light; and a signal detecting device 30 for outputting a digital image signal in proportion to the radiation image based on the charge signals outputted from the radiation image recording device 10 through the scanning of the reading light by the reading light source section 20.

The signal detecting device 30 has an integrating amplifier 31 for integrating the charge signals outputted from the radiation image recording device 10; a first and a second holding circuits 32, 33 for holding electrical signals integrated by the integrating amplifier 31; a differential amplifier 34 for outputting the difference between the first and second electrical signals held by the first and second holding circuits 32, 33 respectively; and an A/D converter 35 for converting the analog signal outputted from the differential amplifier 34 into a digital signal. The signal detecting device 30 performs correlated double sampling based on the charge signals outputted from the radiation image recording device 10.

The integrating amplifier 31 has a capacitor 31a for storing charge signals outputted from the radiation image recording device 10, and a rest switch 31b for discharging the charge signals stored in the capacitor 31a.

The first holding circuit 32 has a resistance element 32a, a switch 32b, and capacitor 32c. The first holding circuit 32 holds an electrical signal outputted from the integrating amplifier 31, and, at the same time, performs low-pass filtering on the electrical signal using a low-pass filter formed by the resistance element 32a and capacitor 32c. Accordingly, a filtered electrical signal, which is the signal outputted from the integrating amplifier 31 and passed through the low-pass filter, is held by the capacitor 32c of the first holding circuit 32.

Here, it is noted that the first holding circuit 32 is a circuit for performing the baseline sampling in the correlated double sampling performed in the signal detecting device 30. At the same time, it performs low-pass filtering on the electrical signal outputted from the integrating amplifier 31, which is the signal for the baseline sampling. In this connection, the time constant τ in the low-pass filtering and the baseline sampling time t are set at values that satisfy the relationship of t≧10×τ. That is, resistance R of the resistance element 32a and capacitance C of the capacitor 32c are selected such that they satisfy the relationship of t≧10×RC, since τ=RC. The sampling time t is controlled by a control circuit to be described later.

The second holding circuit 33 has a resistance element 33a, a switch 33b, and capacitor 33c. The second holding circuit 33 holds an electrical signal outputted from the integrating amplifier 31, and, at the same time, performs low-pass filtering on the electrical signal described above using a low-pass filter formed by the resistance element 33a and capacitor 33c as in the case of the first holding circuit. Accordingly, a filtered electrical signal, which is the signal outputted from the integrating amplifier 31 and passed through the low-pass filter, is held by the capacitor 33c of the second holding circuit 33.

The signal detecting device 30 further comprises buffer amplifiers 36, 37 for receiving the respective filtered electrical signals outputted from the first and second holding circuits 32, 33 and outputting them to the differential amplifier 34 respectively; and a control circuit 38 for controlling the operation timings of the reset switch 31b of the integrating amplifier 31, switches 32b, 33b of the first and second holding circuits 32, 33, A/D converter 35, and the like.

Figure 2:
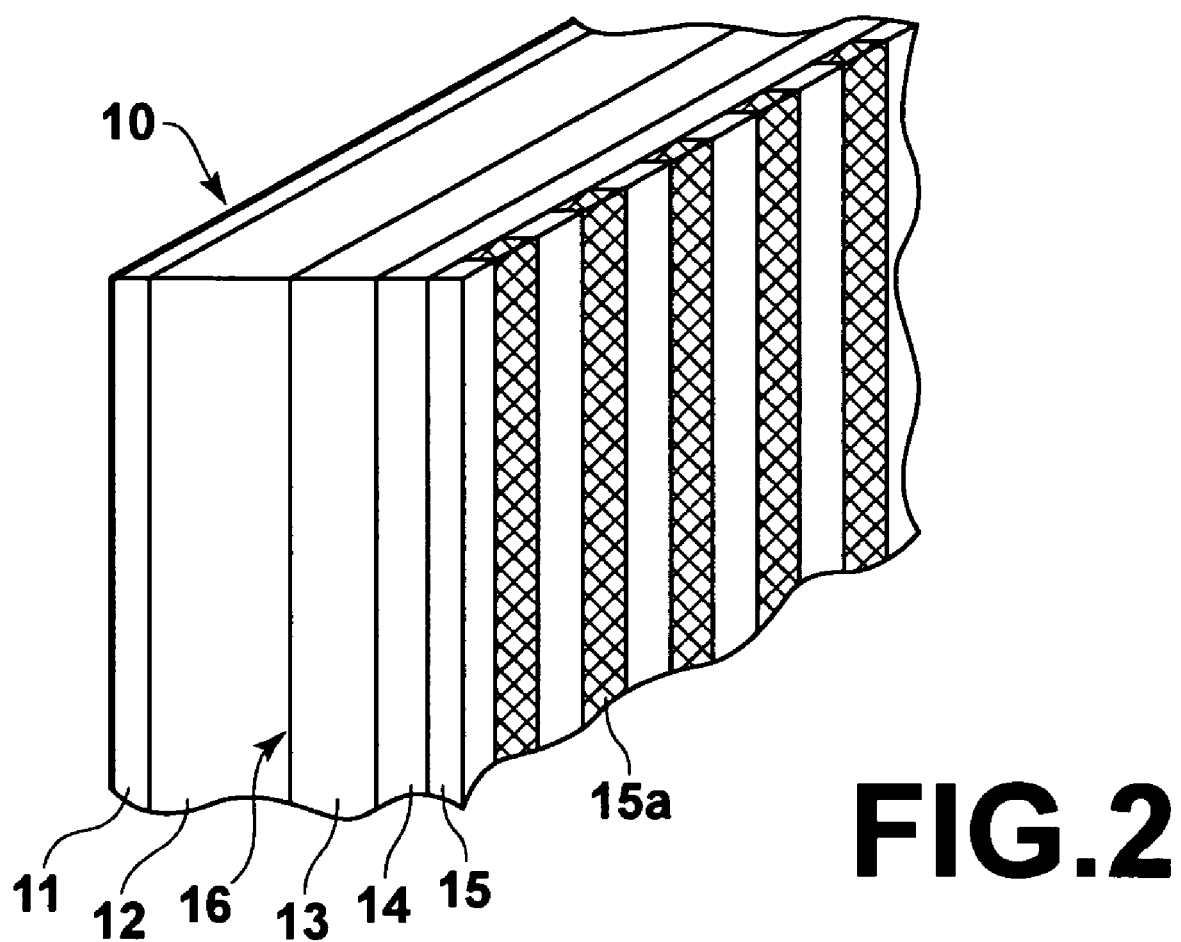
FIG. 2 is a block diagram that illustrates the schematic construction of the radiation image recording device employed in the radiation image signal detecting system shown in FIG. 1.

As shown in FIG. 2, the radiation image recording device 10 specifically comprises a set of layers layered in the order of a first electrode layer 11, which is transparent to radiation that carries a radiation image; a recording photoconductive layer 12 for generating charges by receiving the radiation transmitted through the first electrode layer 11; a charge transport layer 13 that acts as an insulator against charges generated in the recording photoconductive layer 12, and as a conductor for transport charges having a reverse polarity to that of the charges generated in the recording photoconductive layer 12; a reading photoconductive layer 14 for generating charges by receiving reading light; and a second electrode layer 15 comprising linear electrodes 15a disposed in parallel, the electrode 15a being transparent to the reading light and extending linearly. A storage section 16 for storing charges generated in proportion to the dose of radiation is formed at the interface between the recording photoconductive layer 12 and charge transport layer 13.

In FIG. 1, only the signal detecting device 30 connected to one of the linear electrodes 15a of the radiation image recording device 10 is shown, and other signal detecting devices 30 connected to other linear electrodes 15a are not included in the drawing to facilitate the description.

The A/D converter 35 may be provided for each of the linear electrodes 15a, or a single A/D converter 35 may be shared by the linear electrodes by providing a multiplexer, in which the analog signals outputted from the differential amplifiers 34 of the respective linear electrodes 15a are switched and inputted to the single A/D converter 35.

The radiation image recording device 10 and the reading light source section 20 are disposed such that the longitudinal direction of the reading light source of the reading light source section 20 is substantially orthogonal to the longitudinal direction of the linear electrodes 15a of the radiation image recording device 10. The reading light source 20 scans the reading light by moving the linear reading light source in the longitudinal direction of the linear electrodes 15a, but the moving mechanism for moving the reading light source is not shown in the drawing to facilitate the description.

Hereinafter, the operation of the radiation image signal detecting system will be described.

Figure 3A:
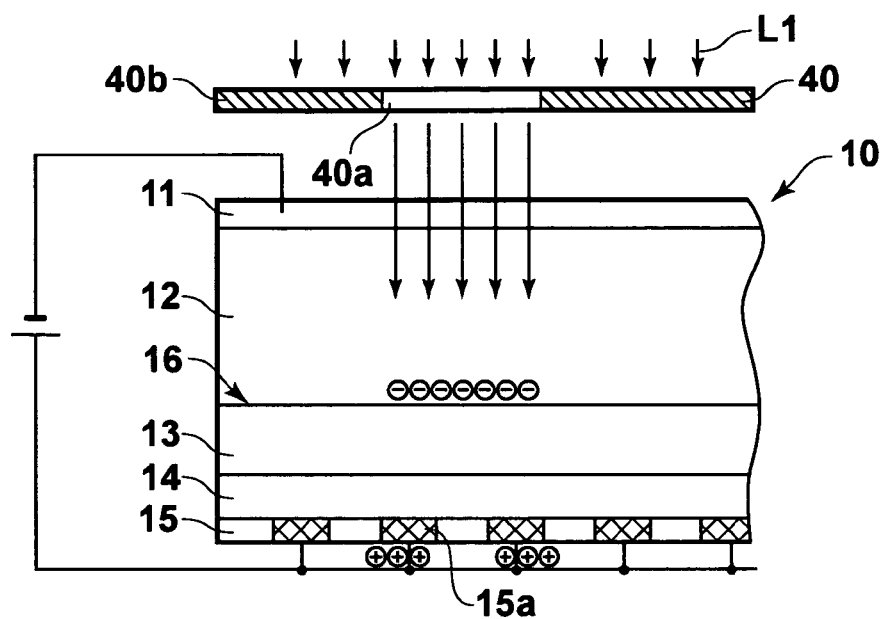
FIG. 3A is a drawing that illustrates the operation of the radiation image recording device employed in the radiation image signal detecting system shown in FIG. 1.

First, radiation L1 is irradiated on a subject 40 from the radiation source with a voltage being applied to the radiation image recording device 10 such that the first electrode layer 11 is negatively charged and the second electrode layer 15 is positively charged. As shown in FIG. 3A, the radiation L1 emitted from the radiation source is irradiated across the subject 40, and a portion of the radiation transmitted through a transparent section 40a of the subject 40, which transmits the radiation, is irradiated on the radiation image recording device 10 from the side of the first electrode layer 11. The portion of the radiation irradiated on the opaque section 40b of the subject 40, which blocks the radiation, is not irradiated on the radiation image recording device 10.

The radiation L1 irradiated on the radiation image recording device 10 is transmitted through the first electrode layer 11 and irradiated on the recording photoconductive layer 12, which causes charge-pairs to be generated in the recording photoconductive layer 12. Positive charges of the charge-pairs so generated move to the negatively charged first electrode layer 11 where they couple with the negative charges and disappear, while the negative charges of the charge-pairs are stored as charges of the latent image in a storage section 16 formed at the interface between the recording photoconductive layer 12 and charge transport layer 13. In this way, the radiation image is recorded in the radiation image recording device 10.

Figure 3B:
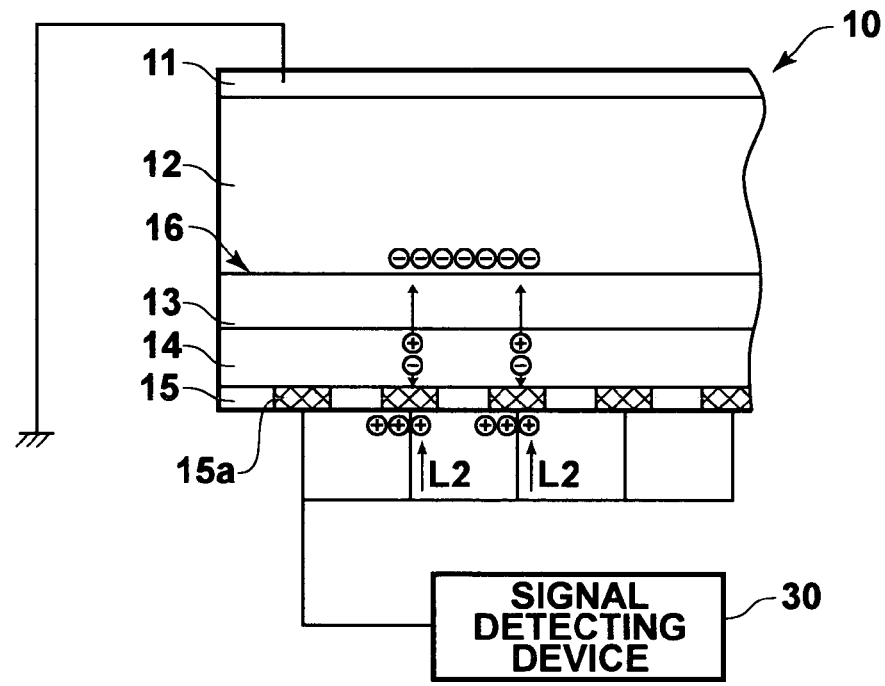
FIG. 3B is a drawing that illustrates the operation of the radiation image recording device employed in the radiation image signal detecting system shown in FIG. 1.

Thereafter, as shown in FIG. 3B, reading light L2 is irradiated on the radiation image recording device 10 from the side of the second electrode layer 15 with the first electrode layer 11 being grounded. The reading light L2 is transmitted through the linear electrodes 15a and irradiated on the reading photoconductive layer 14. Positive charges of the charge-pairs generated in the reading photoconductive layer 14 by the irradiation of the reading light L2 couple with the charges of the latent image stored in the storage section 16, while negative charges of the charge-pairs couple with the positive charges charged on the linear electrodes 15a of the second electrode layer 15.

In the mean time, the reset switch 31b of the integrating amplifier 31 in the signal detecting device 30 has been kept switched ON before the reading light is irradiated on the radiation image recording device 10, and is switched OFF when the irradiation of the reading light is initiated, and negative charges generated in the reading photoconductive layer 14 couple with the positive charges charged on the linear electrodes 15a of the second electrode layer 15 in the manner described above. This causes charge signals to be stored in the capacitor 31a of the integrating amplifier 31 in proportion to the amount of coupled charges.

Figure 4:
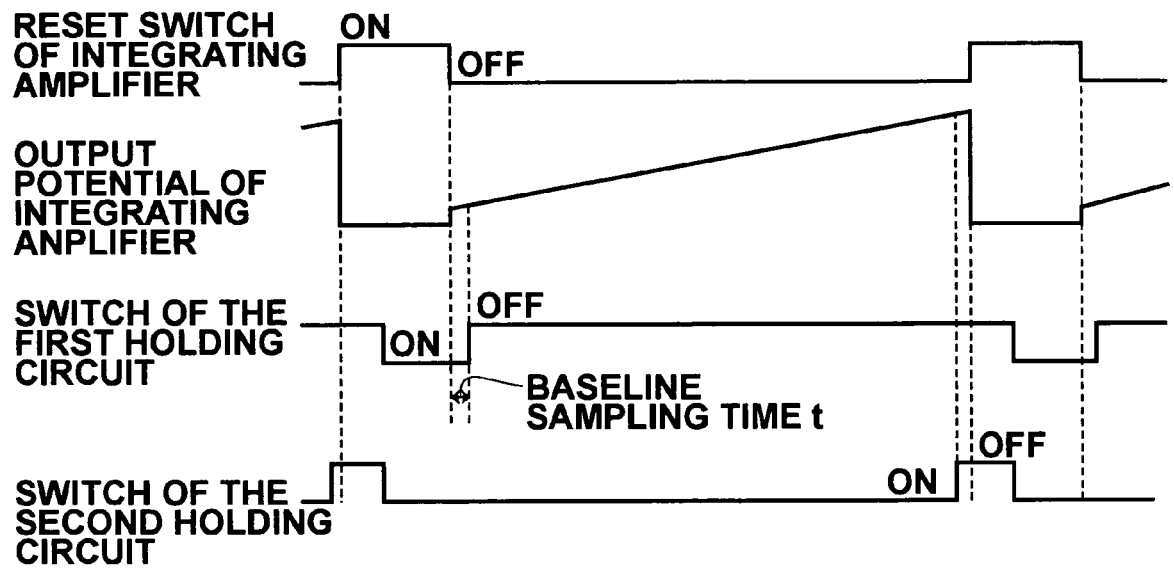
FIG. 4 is a timing chart that illustrates the operation timings of the signal detecting device employed in the radiation image signal detecting system shown in FIG. 1.

As shown in FIG. 4, the switches 32b, 33b of the first and second holding circuits 32, 33 have already been switched ON before the reset switch 31b of the integrating amplifier 31 is switched OFF. When a predetermined baseline sampling time t has elapsed after the reset switch 32b is switched OFF and storage of charge signals by the integrating amplifier is initiated, the switch 32b of the first holding circuit 32 is switched OFF and a first filtered electrical signal outputted from the integrating amplifier 31 and passed through the low-pass filter is held by the capacitor 32c. When a predetermined sampling time has elapsed after the first filtered electrical signal is held and just before the integrating amplifier 31 is reset, the switch 33b of the second holding circuit 33 is switched OFF, and a second filtered electrical signal outputted from the integrating amplifier 31 and passed through the low-pass filter is held by the capacitor 33c.

The first filtered electrical signal held by the capacitor 32c of the first holding circuit 32, and the second filtered electrical signal held by the capacitor 33c of the second holding circuit 33 are outputted to the differential amplifier 34 through the buffer amplifiers 36, 37 respectively. Then, the difference between the first and second filtered electrical signals is calculated in the differential amplifier 34 and outputted to the A/D converter 35. The A/D converter converts the differential signal of the inputted analog signal to a digital signal and outputs it as the image signal.

The image signal detection described above is performed by each of the signal detecting devices 30 connected to each of the linear electrodes 15a for a single line of the reading light irradiated by the reading light source section 20 to complete the image signal detection for that line. Thereafter, the image signal detection for the subsequent lines of the reading light is performed in synchronization with the scanning of the linear reading light in Y direction indicated in FIG. 1 by the reading light source section 20 to ultimately detect all image signals from the entire area of the radiation image recording device 10.

Figure 5:
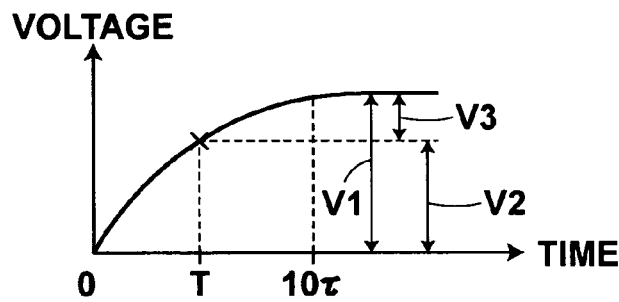
FIG. 5 is a drawing that illustrates the method for setting the time constant $\tau$ of the low-pass filter and baseline sampling time t employed in the signal detecting device of the present invention.

Here, the digital image signal obtained in the manner described above is the differential signal obtained by the differential amplifier 34 by subtracting the first filtered electrical signal from the second filtered electrical signal. The first filtered electrical signal is the signal held by the capacitor 32c of the first holding circuit 32 during the baseline sampling time t as described above. As described above, the first holding circuit 32 also serves as the low-pass filter, so that the voltage of the electrical signal held by the capacitor 32c shows a transient response as illustrated in FIG. 5. Thus, if the baseline sampling time is too short, for example, the time T shown in FIG. 5, only the signal amount indicated by the voltage V2 may be obtained, although the amount indicated by the voltage V1 should normally be obtained as the first filtered electrical signal. Consequently, the amount of the first filtered electrical signal to be subtracted from the amount of the second filtered electrical signal becomes small, and a digital image signal containing a noise component is outputted.

With this in mind, in the present embodiment, the time constant τ in the low-pass filtering and baseline sampling time t are set at values that satisfy the relationship of t≧10×τ as described above, in order to ensure an appropriate sampling time.

Here, data will be shown that will support the appropriateness of the formula, t≧10×τ.

Figure 6A:
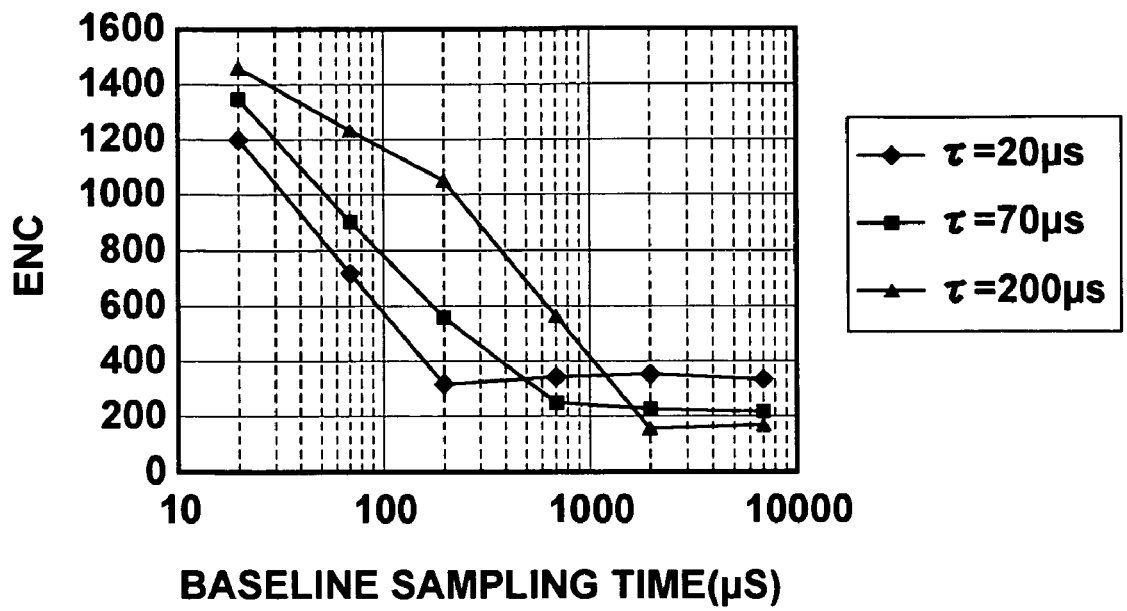
FIG. 6A is a graph that illustrates the measurement results of input equivalent noise charges (ENC) of the integrating amplifier employed in the signal detecting device shown in FIG. 1.
Figure 6B:
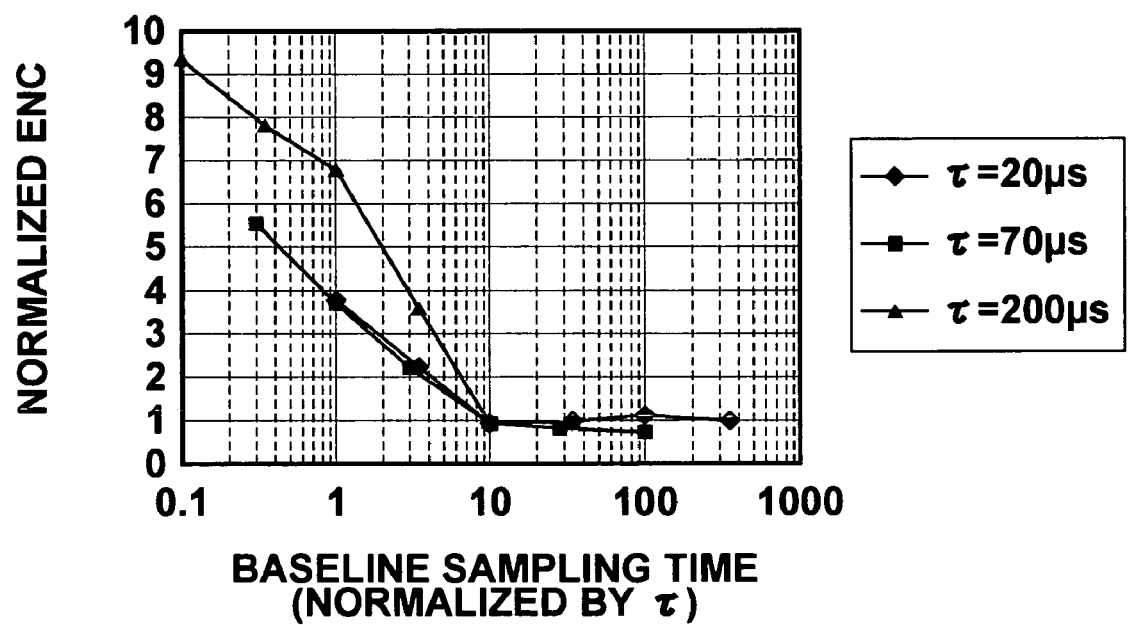
FIG. 6B is a graph that illustrates the measurement results of input equivalent noise charges (ENC) of the integrating amplifier employed in the signal detecting device shown in FIG. 1.

First, the measurements of input equivalent noise charges (ENC) were conducted for the integrating amplifier 31 of the signal detecting device 30 shown in FIG. 1, with the input of the amplifier 31 being kept open. The measurement results are illustrated in FIG. 6A. FIG. 6A indicates the relationship between the baseline sampling time and ENC when the time constant τ in the low-pass filtering is set at 20 μs, 70 μs or 200 μs. The referent of "ENC" as used herein means the standard deviation of input equivalent charge amount N. The input equivalent charge amount N is obtained by the following formula. By evaluating ENC, the amount of noise component of the integrating amplifier 31 included in the signal outputted from the signal detecting device 30.

$$N = C_f \times V_{ad} x / q \times G \times 2^n$$

where, q: elementary charge $(1.6 \times 10^{-19}(C))$
$C_f$: feedback capacitance of the integrating amplifier
G: gain in the latter stages of the integrating amplifier
$V_{ad}$: input voltage range of the A/D converter
n: bit count of the A/D converter
x: digital data outputted from the A/D converter As shown in FIG. 6A, when τ=20 μs, the ENC is substantially minimized when the baseline sampling time reaches to approximately 200 μs and beyond. When τ=70 μs, the ENC is substantially minimized when the baseline sampling time reaches to approximately 700 μs and beyond. When τ=200 μs, the ENC is substantially minimized when the baseline sampling time reaches to approximately 2000 μs and beyond. This proves that when the baseline sampling time t is, t≧10×τ, noise component of the digital image signal outputted from the signal detecting device 30 is minimized. FIG. 6B illustrates the measurement data shown in FIG. 6A normalized by the time constant τ and ENC value of 10×τ. FIG. 6B also clearly shows that ENC is minimized when t≧10×τ.

Figure 7A:
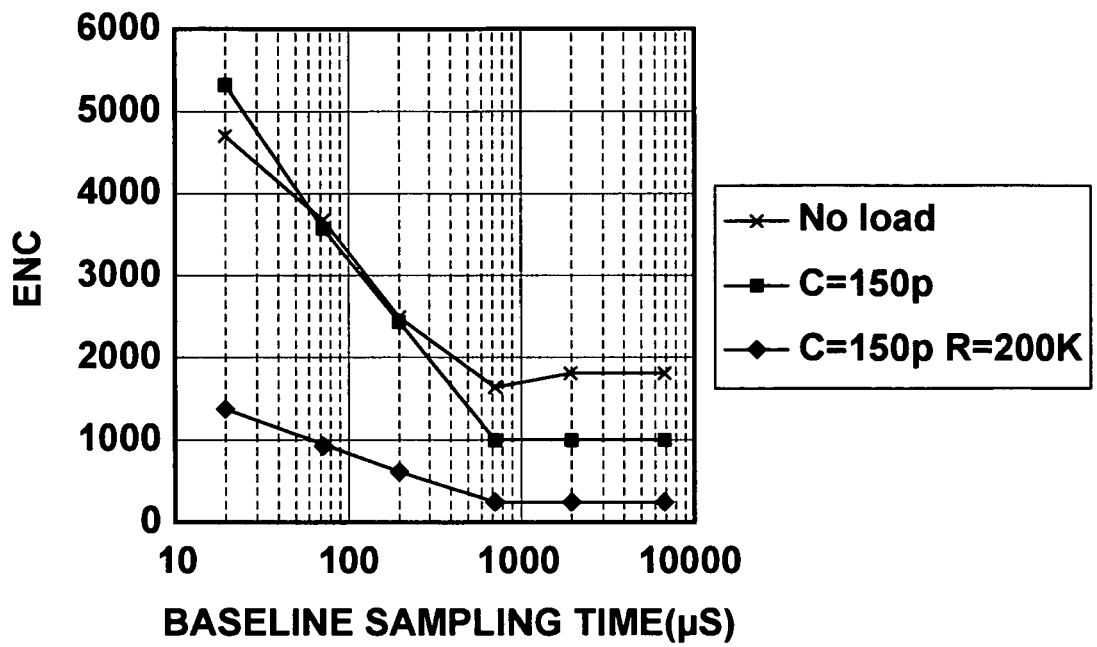
FIG. 7A is a graph that illustrates the measurement results of input equivalent noise charges (ENC) of the integrating amplifier employed in the signal detecting device shown in FIG. 1.
Figure 8:
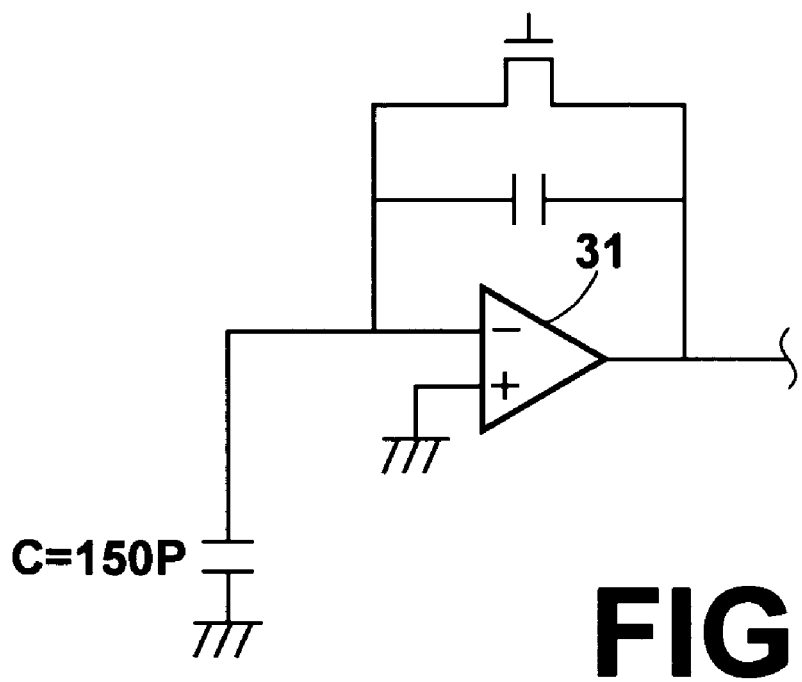
FIG. 8 is a drawing that illustrates a load connected to the input of the integrating amplifier when an ENC evaluation test is performed.
Figure 9:
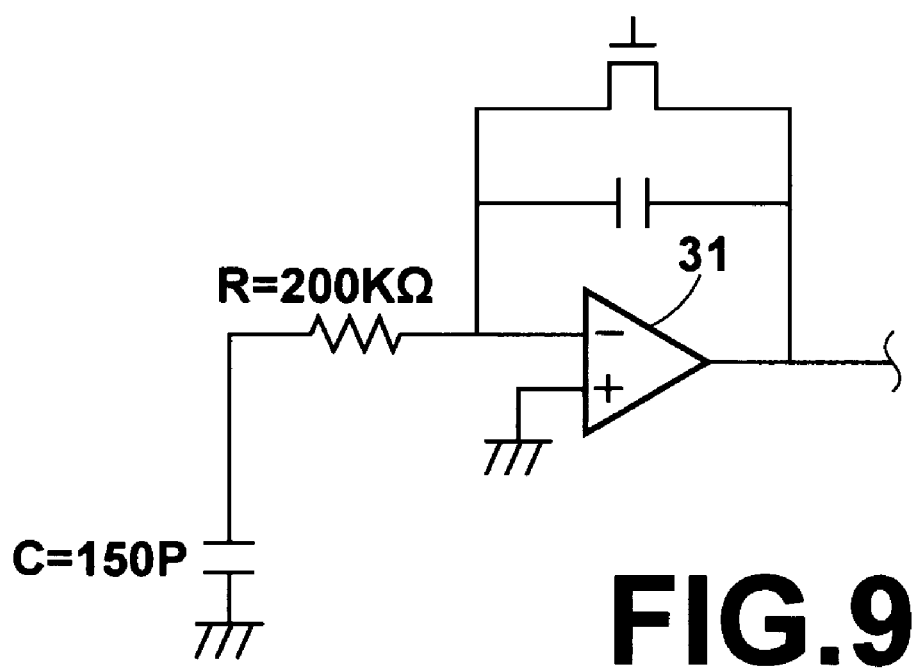
FIG. 9 is a drawing that illustrates a load connected to the input of the integrating amplifier when an ENC evaluation test is performed.

Next, measurements of the input equivalent noise charges (ENC) were conducted for the integrating amplifier 31 of the signal detecting device 30 shown in FIG. 1, with a predetermined load being connected to the input of the amplifier 31. The measurement results are illustrated in FIG. 7A. FIG. 7A shows the measurement results when no load (open), a capacitor C=150 p as shown in FIG. 8, or a capacitor C=150 p and resister element R=200 KΩ as shown in FIG. 9 are connected to the input of the integrating amplifier 31. The time constant in the low-pass filtering is set at 70 μs. The reason for connecting such loads as described above to the input of the integrating amplifier 31 is to simulate the case where the linear electrode 15a of the image recording device 10 is connected to the signal detecting device 30.

Figure 7B:
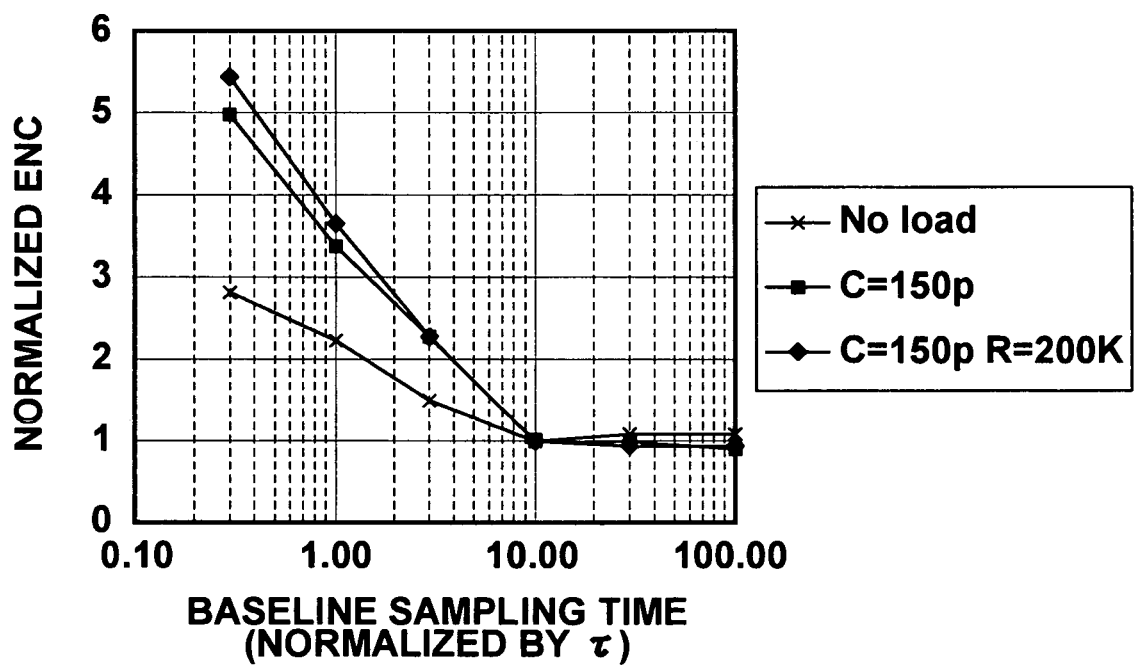
FIG. 7B is a graph that illustrates the measurement results of input equivalent noise charges (ENC) of the integrating amplifier employed in the signal detecting device shown in FIG. 1.

As shown in FIG. 7A, in any loaded condition, the ENC is minimized when the baseline sampling time reaches to 700 μs and beyond. This means that in any loaded condition of the input of the integrating amplifier 31, the noise of the digital image signal outputted from the signal detecting device 30 is minimized when t≧10×τ. FIG. 7B illustrates the measurement data shown in FIG. 7A normalized by the time constant τ=70 μs and ENC value at 10×τ=700 μs. FIG. 7B also shows that ENC is minimized when t≧10×τ in any loaded condition.

According to the radiation image signal detecting system described above, the time constant τ of the low-pass filter and baseline sampling time t are set at values that satisfy the relationship of t≧10×τ, so that an appropriate baseline sampling time which is sufficient to cover the transient response time of the low-pass filter may be ensured, and the electrical signal of noise component that has a sufficient magnitude may be obtained. Consequently, the noise component is prevented from being added to the signal component and the signal-to-noise ratio of the electrical signal is improved.

Furthermore, in the present embodiment described above, the time constant τ of the low-pass filter and baseline sampling time t are set at values that satisfy the relationship of $t \geq 10 \times \tau$. But, the $\tau$ and t are preferably set at values that satisfy the relationship of $20 \times \tau \geq t \geq 10 \times \tau$. In this case, the signal-to-noise ratio of the electrical signal may be improved, and at the same time a certain level of processing speed may be ensured.

Still further, in the present embodiment described above, a so-called optical reading type radiation image detector is described as the device for outputting charge signals to be inputted to the signal detecting device. But the present invention is not limited to this, and, for example, a so-called TFT type radiation image detector may be used. Further, the radiation image detector that detects photostimulated luminescence emitted from a storage phosphor sheet through a photoelectric converter and outputs charge signals may also be used.

Furthermore, in the present embodiment described above, the radiation image detecting system comprises the radiation source, radiation image recording device 10, reading light source section 20, and signal detecting device 30. But the system may comprise the radiation image recording device 10, reading light source section 20, and signal detecting device 30, without the radiation source.

What is claimed is:

1. A signal detecting method, comprising the steps of:
   initiating storage of charge signals by an integrating amplifier;
   holding a first electrical signal outputted from said integrating amplifier when a predetermined baseline sampling time has elapsed from the time when said storage is initiated, and passed through a first low-pass filter; and
   obtaining the difference between a second electrical signal and said first electrical signal to detect the signal, said second electrical signal being outputted from said integrating amplifier after said first electrical signal is held and before said integrating amplifier is reset, and passed through a second low-pass filter,
   wherein the time constant $\tau$ of said first low-pass filter and the baseline sampling time t are set at values that satisfy the relationship of $t \geq 10 \times \tau$,
   wherein said detected signal is outputted, displayed, stored, or otherwise conveyed or used.

2. The signal detecting method according to claim 1, wherein said time constant $\tau$ of said first low-pass filter and said baseline sampling time t are set at values that satisfy the relationship of $20 \times \tau \geq t \geq 10 \times \tau$.

3. The signal detecting method according to claim 1, wherein said detected signal is a radiation image that is outputted, displayed, stored, or otherwise conveyed or used.

4. A signal detecting device, comprising:
   an integrating amplifier for storing charge signals;
   a first low-pass filter for receiving a first electrical signal outputted from said integrating amplifier when a predetermined baseline sampling time has elapsed from the time when said storage is initiated by said integrating amplifier;
   a first holding circuit for holding said first electrical signal passed through said first low-pass filter;
   a second low-pass filter for receiving a second electrical signal outputted from said integrating amplifier after said first electrical signal is held by said first holding circuit and before said integrating amplifier is reset;
   a second holding circuit for holding said second electrical signal passed through said second low-pass filter; and
   a differential circuit for obtaining the difference between said second electrical signal and said first electrical signal to detect the signal, wherein
   the time constant $\tau$ of said first low-pass filter and the baseline sampling time t are set at values that satisfy the relationship of $t \geq 10 \times \tau$.

5. The signal detecting device according to claim 4, wherein said time constant $\tau$ of said first low-pass filter and said baseline sampling time t are set at values that satisfy the relationship of $20 \times \tau \geq t \geq 10 \times \tau$.

6. A radiation image signal detecting method, comprising the steps of:
   storing charge signals outputted from a radiation image recording device constructed to receive radiation to store charges and output charge signals in proportion to said charges stored therein by an integrating amplifier;
   holding a first electrical signal outputted from said integrating amplifier when a predetermined baseline sampling time has elapsed from the time when said storage is initiated, and passed through a first low-pass filter; and
   obtaining the difference between a second electrical signal and said first electrical signal to detect the signal, said second electrical signal being outputted from said integrating amplifier after said first electrical signal is held and before said integrating amplifier is reset, and passed through a second low-pass filter,
   wherein the time constant $\tau$ of said first low-pass filter and the baseline sampling time t are set at values that satisfy the relationship of $t \geq 10 \times \tau$, and
   wherein said detected signal is a radiation image that is outputted, displayed, stored, or otherwise conveyed or used.

7. The radiation image signal detecting method according to claim 6, wherein said time constant $\tau$ of said first low-pass filter and said baseline sampling time t are set at values that satisfy the relationship of $20 \times \tau \geq t \geq 10 \times \tau$.

8. A radiation image signal detecting system, comprising:
   a radiation image recording device constructed to receive radiation to store charges therein and output charge signals in proportion to said charges stored therein;
   an integrating amplifier for storing said charge signals outputted from said radiation image recording device;
   a first low-pass filter for receiving a first electrical signal outputted from said integrating amplifier when a predetermined baseline sampling time has elapsed from the time when said storage is initiated by said integrating amplifier;
   a first holding circuit for holding said first electrical signal passed through said first low-pass filter;
   a second low-pass filter for receiving a second electrical signal outputted from said integrating amplifier after said first electrical signal is held by said first holding circuit and before said integrating amplifier is reset;
   a second holding circuit for holding said second electrical signal passed through said second low-pass filter; and
   a differential circuit for obtaining the difference between said second electrical signal and said first electrical signal to detect the signal, wherein
   the time constant $\tau$ of the first low-pass filter and the baseline sampling time t are set at values that satisfy the relationship of $t \geq 10 \times \tau$.

9. The radiation image signal detecting system according to claim 8, wherein said time constant $\tau$ of said first low-pass filter and said baseline sampling time t are set at values that satisfy the relationship of $20 \times \tau \geq t \geq 10 \times \tau$.

* * * * *